United States Patent [19]

Rhodes et al.

[11] Patent Number: 4,937,475

[45] Date of Patent: Jun. 26, 1990

[54] LASER PROGRAMMABLE INTEGRATED CIRCUIT

[75] Inventors: F. Matthew Rhodes, Arlington; Jack I. Raffel, Lexington, both of Mass.

[73] Assignee: Massachusetts Institute of Technology, Cambridge, Mass.

[21] Appl. No.: 246,311

[22] Filed: Sep. 19, 1988

[51] Int. Cl.$^5$ .................... H04Q 1/00; H03K 17/693; H03K 19/096; H03K 3/01

[52] U.S. Cl. ............................... 307/465; 307/465.1; 307/468; 307/202.1; 364/716; 364/784; 340/825.84; 340/825.86; 340/825.87; 340/825.91

[58] Field of Search .............. 307/465, 466, 467, 468, 307/469, 471, 465.1, 202.1; 364/716, 784; 340/825.83–825.91; 365/96

[56] References Cited

U.S. PATENT DOCUMENTS

| | | | |
|---|---|---|---|
| 4,207,556 | 6/1980 | Sugiyama et al. | 340/166 |
| 4,366,393 | 12/1982 | Kasuya | 307/465 X |
| 4,404,635 | 9/1983 | Flaker | 364/481 |
| 4,433,331 | 2/1984 | Kollaritsch | 340/825.83 |
| 4,455,495 | 6/1984 | Masuhara et al. | 307/44 |
| 4,499,579 | 2/1985 | Still et al. | 371/15 |
| 4,541,067 | 9/1985 | Whitaker | 307/471 X |
| 4,543,594 | 9/1985 | Mohsen et al. | 357/51 |
| 4,551,815 | 11/1985 | Moore et al. | 307/465 X |
| 4,558,236 | 12/1985 | Burrows | 307/465 |
| 4,600,846 | 7/1986 | Burrows | 307/465 |
| 4,617,723 | 10/1986 | Mukai | 29/576 |
| 4,622,648 | 11/1986 | Whitaker | 364/784 X |
| 4,642,487 | 2/1987 | Carter | 307/465 |
| 4,665,295 | 5/1987 | McDavid | 219/121 |
| 4,670,749 | 6/1987 | Freeman | 307/465 X |
| 4,689,654 | 8/1987 | Brockmann | 357/45 |
| 4,700,187 | 10/1987 | Furtek | 307/465 X |
| 4,706,217 | 11/1987 | Shimizu et al. | 307/465 X |
| 4,717,912 | 1/1988 | Harvey et al. | 307/465 X |
| 4,723,155 | 2/1988 | Uchida | 357/51 |
| 4,727,268 | 2/1988 | Hori | 307/465 |
| 4,742,252 | 5/1988 | Agrawal | 307/465 |
| 4,742,383 | 5/1988 | Fitzgerald | 307/465 X |
| 4,758,745 | 7/1988 | Elgamal et al. | 307/465 |
| 4,774,421 | 9/1988 | Hartmann et al. | 307/465 |

*Primary Examiner*—Stanley D. Miller
*Assistant Examiner*—David R. Bertelson
*Attorney, Agent, or Firm*—Hamilton, Brook, Smith & Reynolds

[57] ABSTRACT

A laser programmable integrated circuit chip has a plurality of logic modules organized as rows and columns. The modules and other chip components are connected by a grid-like array of conductors. The conductors are initially unattached. Customization occurs by fusing laser diffuseable links and severing cut points on the conductors. The modules have continuous conductor lines running through them. These conductor lines aid in testing and are useful in routing and error avoidance. The chip also contains test registers to test the array of logic modules, the input/output blocks, and the conductors.

24 Claims, 9 Drawing Sheets

LASER PROGRAMMABLE INTEGRATED CIRCUIT

The Government has rights in this invention pursuant to grant Number F19628-85-C-0002 awarded by the Department of the Air Force.

BACKGROUND OF INVENTION

This invention relates to integrated circuit technology, and more particularly to laser programmable integrated circuit technology.

Integrated circuits rely on metal interconnections as a means of linking individual logic components together. It is this combination of logic components that allows the integrated circuit to perform desired functions. One method of programming integrated circuits is masking. Masking entails placing a mask over the integrated circuit containing unconnected logic components and making connectors along the paths exposed in the mask. Typically, this method is employed to connect special purpose logic components designed exclusively to perform a given function. However, it may also be employed to connect general purpose logic modules.

Mask fabrication, however, takes weeks or even months. Furthermore, once a mask is fabricated, it is not easily changed. To customize different integrated circuits, a different mask must be used and, of course, the resulting cost in time must be paid. This delay represents a significant hurdle in minimizing the time required for manufacture. One response has been to utilize an alternate approach not requiring masks.

The alternate approach utilizes arrays of metal interconnections. Under this approach the array acts as a foundation through which the programmed path will be made. Initially, the array is totally unprogrammed. Each path is programmed individually by linking crossing interconnectors and/or breaking interconnectors to produce the desired connections and cuts and ultimately, to produce the desired function.

DISCLOSURE OF THE INVENTION

In accordance with one aspect of the present invention, a laser programmable integrated circuit has an array of logic modules in connection with a grid-like array of first and second sets of orthogonal conductors. The sets of conductors are initially unconnected at cross-points. Attached to the conductors are laser diffuseable links which can connect orthogonal conductors when irradiated by a laser beam.

It is preferable that the logic modules are functional units each of which produces an expected result when a vector is applied to the module. Likewise, it is preferable that each logic module be capable of realizing any combinatorial function of two inputs so as to allow greater flexibility and capability in programming. A preferred logic module comprises: a first two input AND gate; a second two input AND gate wherein one input is the output of a two input NOR gate, the NOR gate having one input which is also an input for the first AND gate; a two input NOR gate wherein the inputs consist of the outputs of the two AND gates; an inverter connected to the output of the NOR gate which produces an output FN which is also an output for the module; a second inverter connected to the output of the previous inverter which produces an output, which is also an output, F, for the module; and an enabling means attached to both inverters. This particular configuration allows all combinatorial functions of two inputs to be performed in an efficient and easily implemented package.

Preference is also given to a logic module which has continuous lines connecting leads from one side of the module to the leads on the opposite side of the module. This continuity assists in testing, in error avoidance, and in routing. Furthermore, it is preferred that the modules be arranged in parallel rows and columns so as to assist testing and routing.

The grid-like array of sets of conductors may connect logic modules to other logic modules on a chip, to chip inputs and outputs, and to chip testing registers. Moreover, it is preferable that the sets of conductors are initially unconnected. This lack of connection facilitates easy testing and requires fewer connection/disconnection points to program than would be required if all conductors were initially connected and only disconnections were required.

In addition, it is preferred that the laser diffuseable link comprise two back-to-back diodes formed by doped regions implanted into a substrate separated by a gap of a few microns. The sets of conductors may be severed at given cut points and that the laser diffuseable links may be connected through application of a laser beam to program the connection of logic modules. Further, the links and cut points may be arranged such that there is a link corresponding to each cross-point of the sets of orthogonal conductors. In a preferred arrangement, pairs of links are located together and the cut points are located in every other conductor segment between cross-points of the first and second conductors. This arrangement allows a great variety of potential paths while minimizing area used.

It is similarly preferable that test registers be formed on a chip to test for errors in the logic modules and conductors. Such registers are economical and easily implemented.

Another feature of the present invention is a means for substantially decreasing the parasitic capacitance of nondiffused links by applying a back voltage to the nondiffused links to create an increased reversed-diode bias.

The present invention further includes a laser programmable integrated circuit utilizing laser diffused links in which logic modules are arranged in parallel columns and rows, having continuous lines from leads on one side of the module to leads on the other side of the module. It is preferred that enable lines be connected to the rows of logic modules so that entire rows may be enabled or disabled. Moreover, it is preferred that each logic module can be individually disabled by the laser. This capability allows a programmer to disable an entire row or to isolate individual modules. This has important implications in avoiding fabrication errors. If an error is discovered, for example, an entire row may be skipped while maintaining the same topology and thus, avoid the necessity of rerouting.

BRIEF DESCRIPTION OF THE DRAWINGS

The foregoing and other objects, features and advantages of the invention will be apparent from the following more particular description of the preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENT

Figure 1:
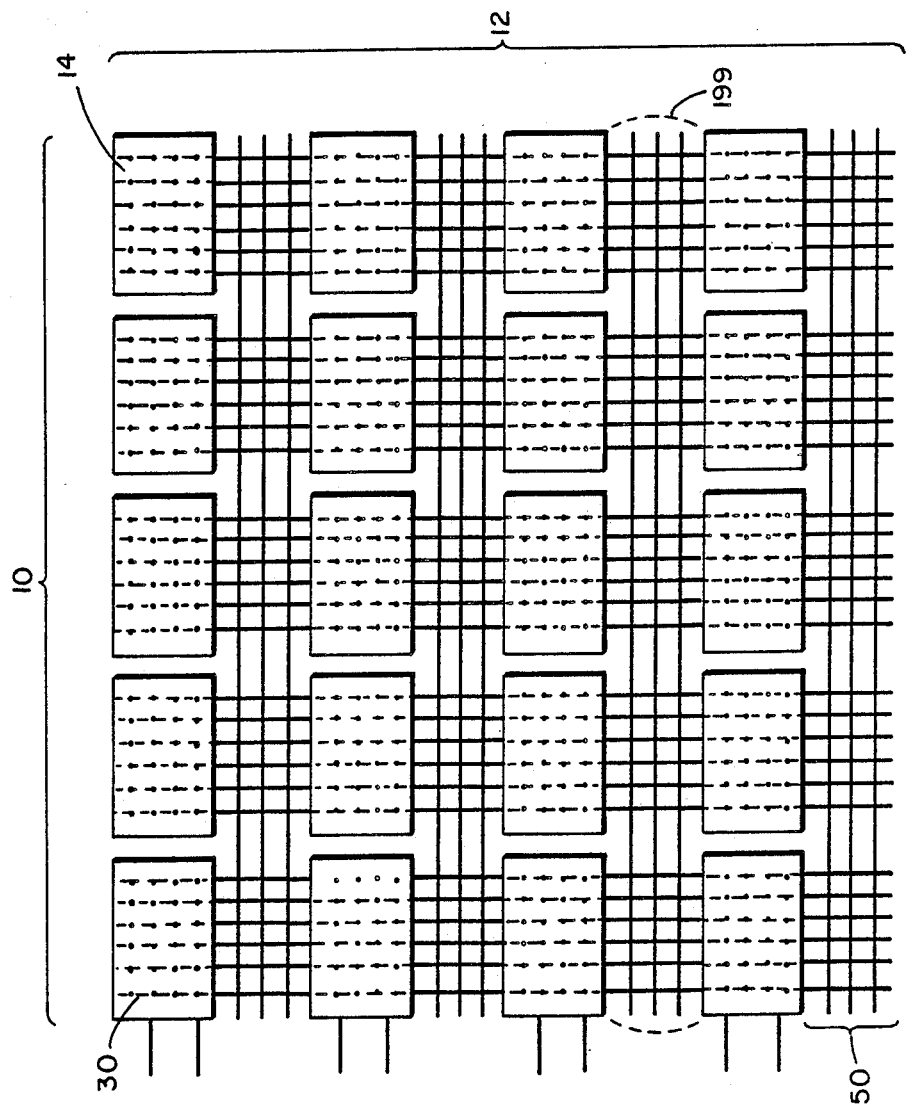
FIG. 1 is a schematic illustration of the arrangement of logic modules on the integrated circuit.
Figure 2:
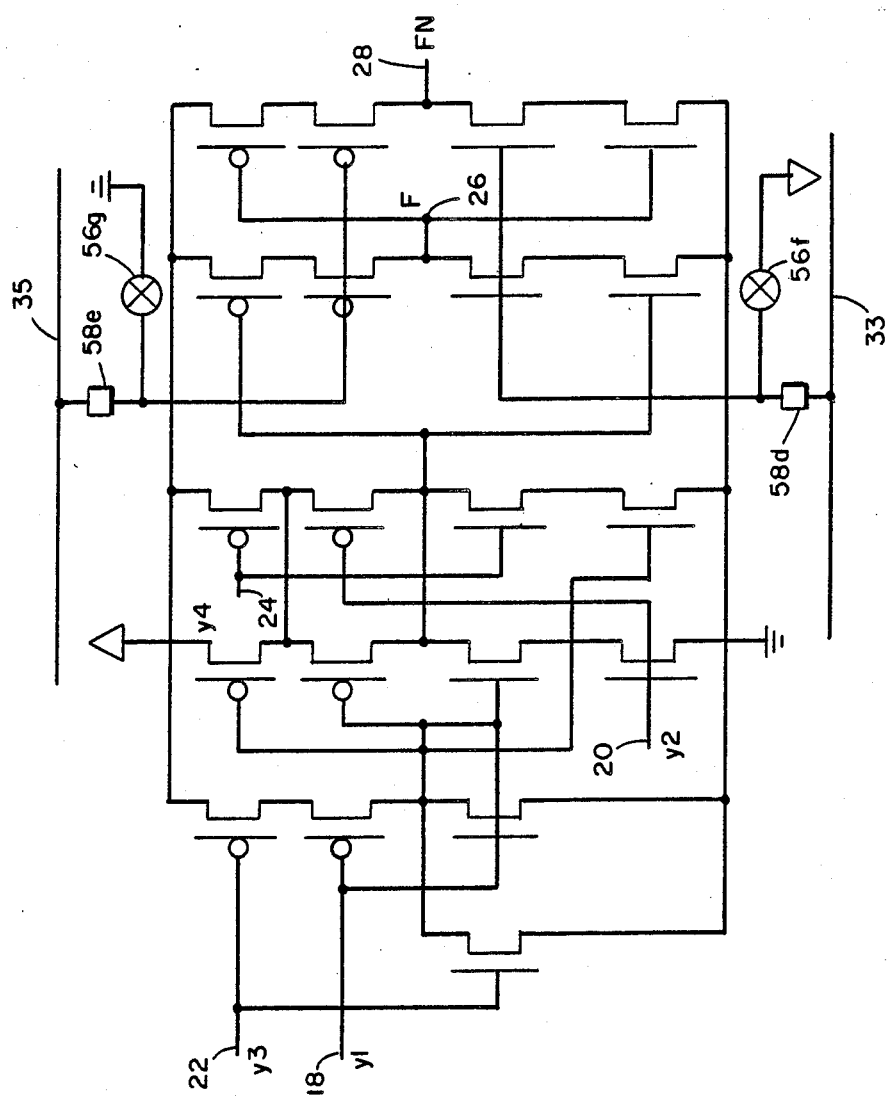
FIG. 2 is a schematic diagram of a logic module.

As seen in FIG. 1, the laser programmable integrated circuit has parallel rows 12 and columns 10 of logic modules 14. Each logic module 14 (FIG. 2) has six leads on each upper and lower side as viewed in FIG. 1. Four of the leads are for input: $Y_1$ 18, $Y_2$ 20, $Y_3$ 22, $Y_4$ 24; and two are for output: F 26 and FN 28. The leads are connected to their corresponding mates on the opposite side of each module via vertical interconnects 30 shown as broken lines through the modules in FIG. 1. This scheme allows for ease in routing by allowing signals to enter either side of the logic module 14 and facilitates testing as will be discussed below. There are also an enable line 33, and disable line 35 which run through each row of modules. These lines, initially, are connected to the module. However, during programming it may be desired to turn off an individual module without turning off all the other modules in a row. A module is disconnected by severing the enable line at a laser cut point 58d; tying the severed enable line low through the use of a laser diffuseable link 56f; severing the disable line at another laser out point 58e; and tying the severed disable line high through another laser diffuseable link 56g. Because of the vertical interconnects 30 (FIG. 1), disablement of a module causes it to act as six vertical interconnect channels capable of use in signal routing.

Figure 3:
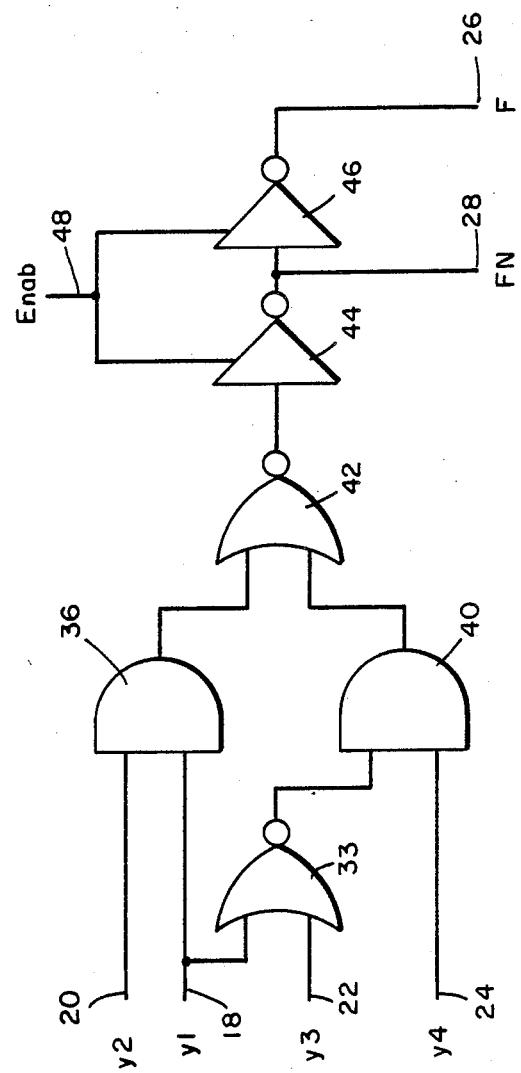
FIG. 3 is a logic diagram of the preferred logic module.

From a logical perspective, the module comprises components as seen in FIG. 3. The inputs $Y_2$ 20 and $Y_1$ 18 enter an AND gate 36. The inputs $Y_1$ 18 also enters a NOR gate 38 along with the input $Y_3$ 22. The output of this NOR gate 38 enters a second AND gate 40 along with the input $Y_4$ 24. The output from the two AND gates enters a second NOR gate 42. The output from this "NOR" gate 42, in turn, enters an inverter 44. The output of this inverter is FN 28. The output branches into a second inverter 46. The output from this second inverter is F 26. An enable line 48 is tied to the inverters 44, 46 for enabling or disabling a module as discussed below.

These logic modules 14 are functional units which produce an expected result when a vector is applied to the modules. In fact, these are capable of performing any combinatorial function of 2 inputs such as the AND, OR, NAND, NOR functions.

Figure 4:
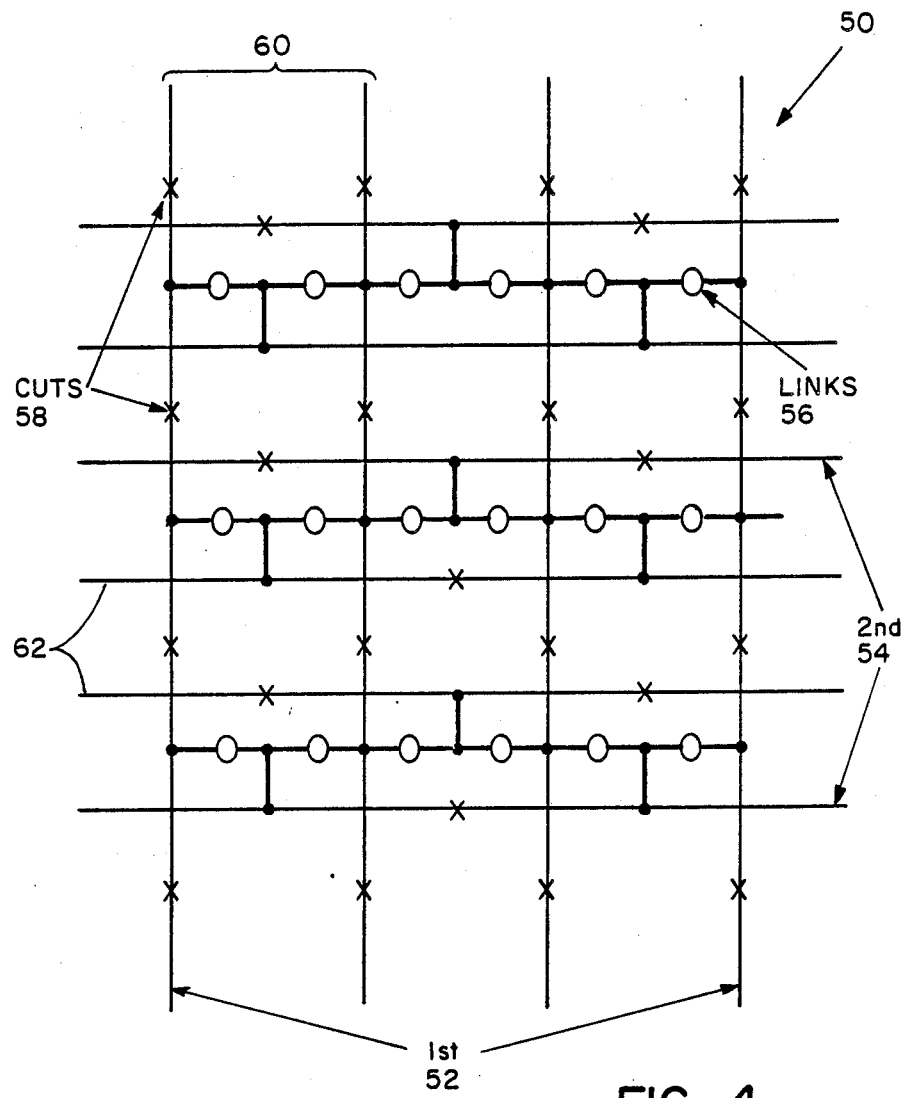
FIG. 4 is a schematic illustration of the pattern of cut points and laser diffused links within the module array of the preferred embodiment.

The logic modules 14 are interconnected to each other and to the rest of the integrated circuit components via a grid-like array 50 (FIGS. 1 and 4) of a first set of conductors 52 which pass through columns of modules which pass between rows of modules and a second set of conductors 54 (FIG. 4). The number of conductors in the first set corresponds to the number of input/output leads per module per column. Any number of conductors may be included in the second set; although only three are shown in FIG. 1 between each row of modules, in the preferred implementation has eight.

The first set of conductors 52 may be connected to second set of conductors 54 via laser diffuseable links 56. Also, the first set of conductors 52 and second set of conductors 54 may be severed at laser cut points 58. Initially, there are no diffused links or severed conductors. The actual programming of the integrated circuit includes of plotting a route between components by diffusing links 56 and severing conductors 52, 54. Further, the first set of conductors 52 and second set of conductors 54 are electrically isolated; otherwise, there would be connections initially.

The links 56 are arranged as shown in FIG. 4. They are arranged so as to allow connections corresponding to every cross-point of the first 52 and second set of conductors 54. The links 56 are paired and positioned between every other pair 54 of the second set of conductors. In addition, the pairs of links alternate as to which of the second conductors 54 of the pairs of conductors they attach. However, there is a link corresponding to each cross-point of a first conductor over a second conductor.

The out points 58 are arranged as shown in FIG. 4. Cut points 58 appear in the first conductors between every other pair of second conductors 62. They also appear in alternating segments of second conductors 54, the segments being staggered from conductor 54 to conductor.

Figure 5:
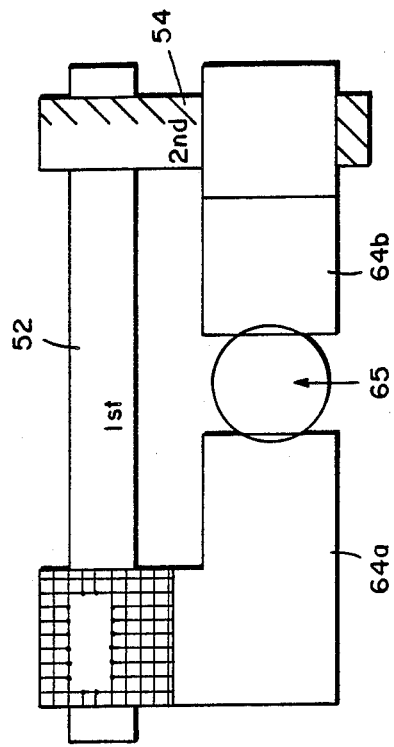
FIG. 5 is a schematic illustration of the laser diffused link as viewed from above.
Figure 6:
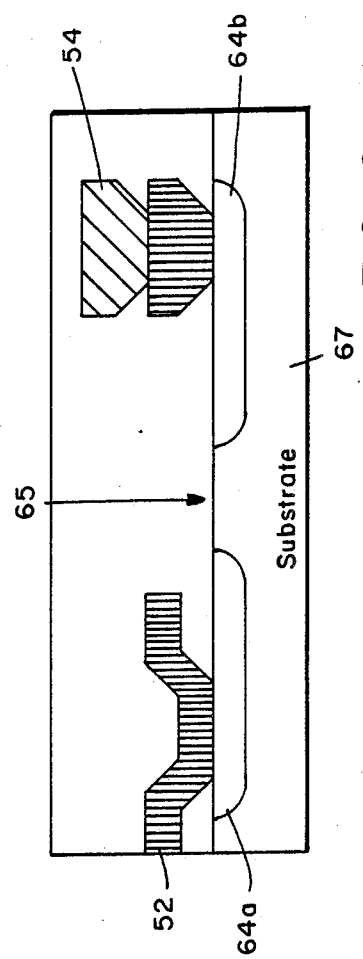
FIG. 6 is a schematic illustration of a cross section of the laser diffused link.

A preferred laser diffuseable link is as shown in U.S. patent application Ser. No. 65,320, filed by Canter et al., June 22, 1987, and assigned to the assignee of this invention. An example for a laser link for wafer-scale integration using standard IC processing, is shown in FIGS. 5 and 6. It is comprised of two back-to-back diodes 64a, 67 and 64b, 67 separated by a gap of a few microns 65. The diodes are formed by heavily doping regions 64a, 64b in a substrate 67. The regions are implanted through normal oxide windows like those which define the source and drain regions of a transistor. The diodes are connected to the horizontal wires 52 and vertical wires 54, respectively. The links are connected in programming by aiming a laser at the gap 65 between the doped regions 64a, 64b and, thus, causing dopant to be redistributed into the gap 65 to create a new connection. The arrays of regions 64a, 64b are formed in wells 199 (FIG. 1). An increased bias voltage opposite is potential to the potential applied to the conductors is applied to the wells. The effect of applying the voltage is to substantially decrease parasitic capacitance of such links 56.

Figure 7:
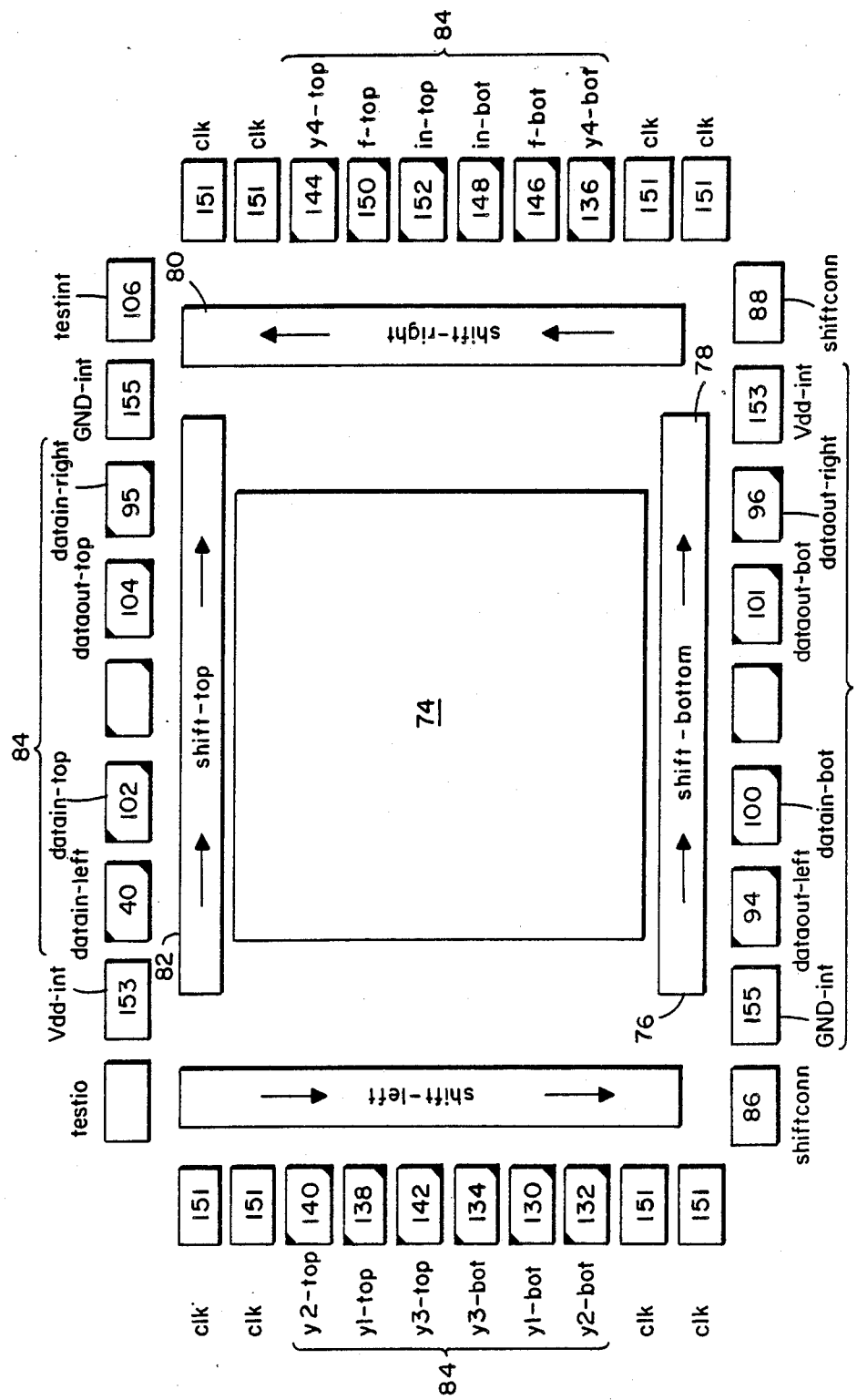
FIG. 7 is a schematic illustration of the architecture of the chip.

The location of the logic array 74 with respect to other components of the integrated circuit chip is shown in FIG. 7. The array 74 comprises the majority of the chip. The chip also has four sets of test registers 76, 78, 80, 82. Surrounding the registers are a plurality of input/output (I/O) blocks 84, clock inputs 151, power inputs 153, 155, and a set of testing control signals 86, 88, 106, 158. Any number of I/O blocks may be provided, but in a preferred implementation, there is an I/O block for each row of modules and for each column. In FIG. 7, only those which are also used for testing are shown. The labels shown are for testing, but the same blocks are used in normal operation of the programmed chip. Eight additional leads are reserved for clock signals 151. Two more are used to supply power 153, and two others are used as grounds 155. The test registers 76, 78, 80, 82 are used to test both the array, conductors, and input/output blocks 84.

Testing occurs after fabrication of the chip but prior to programming. Testing at this stage of the manufacturing process saves both time and money. In particular, if the chip is irretrievably defective, the problem can be identified and the chip discarded without incurring the costs of programming. This results in lower losses than if the chip were tested after customization (i.e. programming). Furthermore, if the chip is only minimally defective, it need not be discarded. It can be reprogrammed to circumvent the defective areas. Also, fabrication of the chip takes less time than with conventional chips because the extensive connections need not be layed out prior to programming. Hence, discarding a defective chip represents a smaller loss in time which translates into a smaller loss in money.

The number of stages in each chip test registers at the top 82 and bottom 78 of the array 74 is equal to the number of module columns 10, which is twice the number of input/output blocks 84 on each of the top and bottom edges of the chip. The number of stages in the test registers on each of the left 76 and right 80 of the array 74 is similarly equal to the number of rows of modules and twice the number of input/output blocks 84 on each of the left and right of the chip.

The testing occurs in several stages. First, the test registers 76, 78, 80, 82 on the chip must be caused to act as shift registers. This is done by applying a high signal to the shift control signals 86, 88. Next, bit sequences may be passed through each register as the outputs are monitored. For example, a signal is fed into the test register 76 via the datain-left block 90 and the output is taken from dataout-left block 94. This process is repeated running different patterns through the registers The same pattern put in through the datain-left block 90 should come out at the dataout-left block 94 as the pattern is shifted through the registers. This same process is duplicated when testing the right test registers 80. The signals are fed in via the datain-right block 95 and come out the dataout-right block 96.

Successive stages of each of the left 76 and right 80 shift registers are connected via the second set of conductors 54. Connectors between register stages follow a serpentine path through the array 74. Half of the conductors 54 are coupled between stages of the shift register 76 and the other half are coupled between stages of the register 80. Because all stages and conductors are in series any discontinuities in the conductors can be detected. The conductors to the two registers are interleaved so that, with proper selection of bit patterns passed simultaneously through the registers, any shorts between conductors can be detected. Hence both the second set of conductors 54 as well as the shift registers 76, 80 may be tested simultaneously.

A series of signals are, likewise, put into the bottom test registers 78 via the datain-bot block 100. The shift register can, once again, be tested by comparing the pattern fed into the register with the pattern exiting the dataout-bot block 101. Similarly, this can be done for the top register 82 using the datain-top block 102 and dataout-top block 104.

The last patterns fed into the registers 76, 78, 80, 82 are the test patterns used to test the individual modules 14 and the first set of conductors 52 (FIGS. 1 and 4). These patterns each comprise a series of low signals and one high signal to select a row or column. For purposes of illustration, suppose that the left register 76 and bottom register 78 are being used. Both contain patterns with all low signals and one high signal. Initially, the high signals are in the first stages of the respective sets of registers 76, 78. At this point, the shiftconn control signals 86, 88 are dropped so that they are no longer high. The pattern, however, stays on the registers. The testing control signal 106 is, then, set high. The module 14 corresponding to the row and column linked to the shift registers with the high signals can now be exercised.

Figure 8:
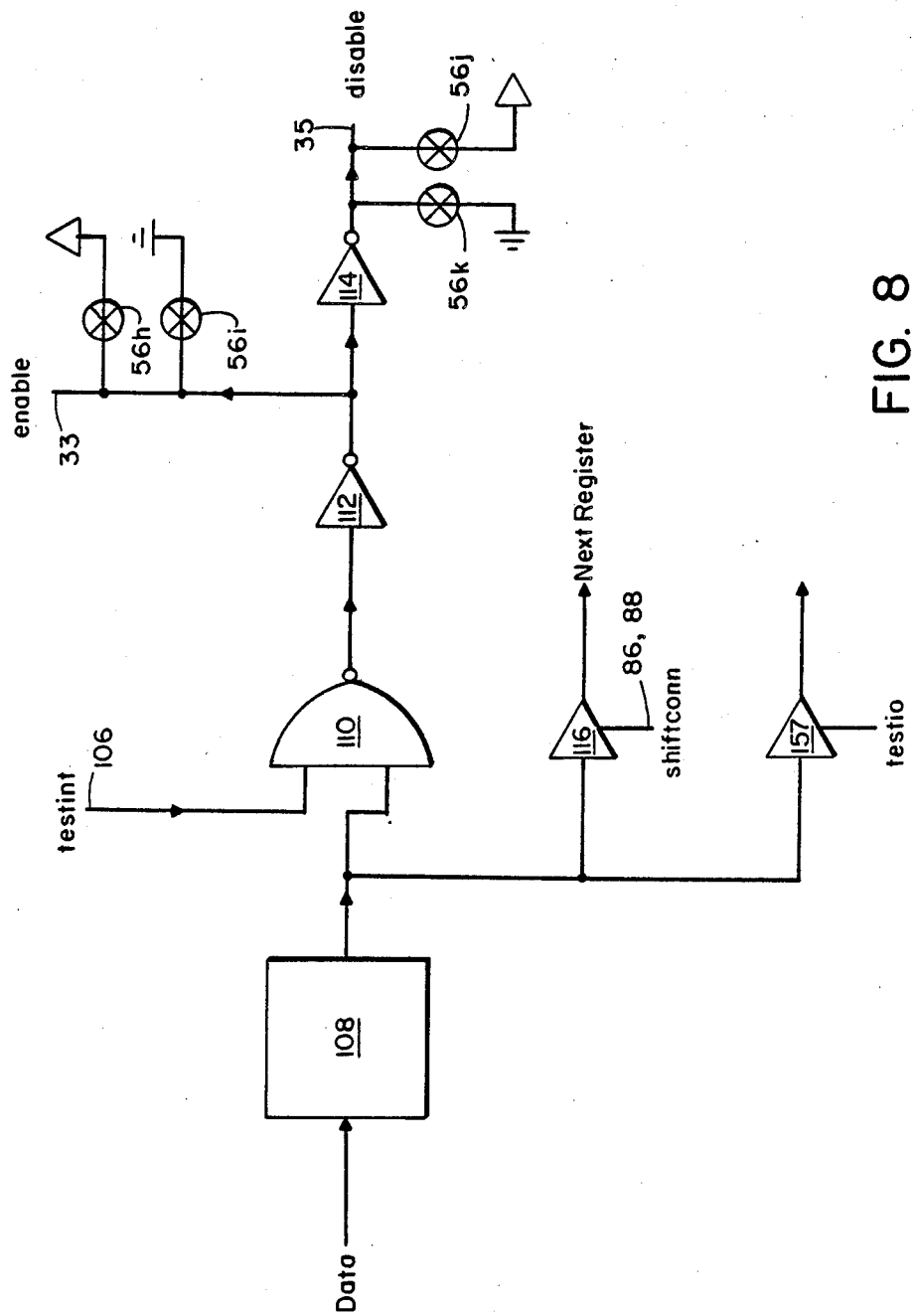
FIG. 8 is a logic diagram of a shift register on the left and right sides of chip.

In order to understand how the module 14 can be selected and exercised it is necessary to look at the logic of the row shift registers 76, 80. FIG. 8 illustrates the logic employed in one stage of the registers. Test data enters a flip/flop 108. It, then, exits the flip/flop and enter a two input NAND gate 110. The other input is connected to testing block 106. The output of this NAND gate 110 then enters an inverter 112. The output of this inverter 112 branches with one branch being the row enable 33 and the other branch entering a second inverter 114. The output of this second inverter is attached to the row disable 35. The row enable may be tied high through the use of a laser diffuseable link 56h or low through the use of a separate laser diffuseable link 56i; similarly, a link 56j is provided to tie the disable high and another link 56k ties the disable low. Tying the enable line 33 high and disable 35 low enables a row. On the other hand, tying the disable line 35 high and the enable line 33 low disables a row. Hence, if both testing 106 and data held by the flip-flop 108 are high, the row of modules corresponding to that stage of the register is enabled; otherwise, it is disabled. The data also enters a driver 116 which passes the data on to the next stage, through the conductors 52, if shiftconn is high.

Figure 9:
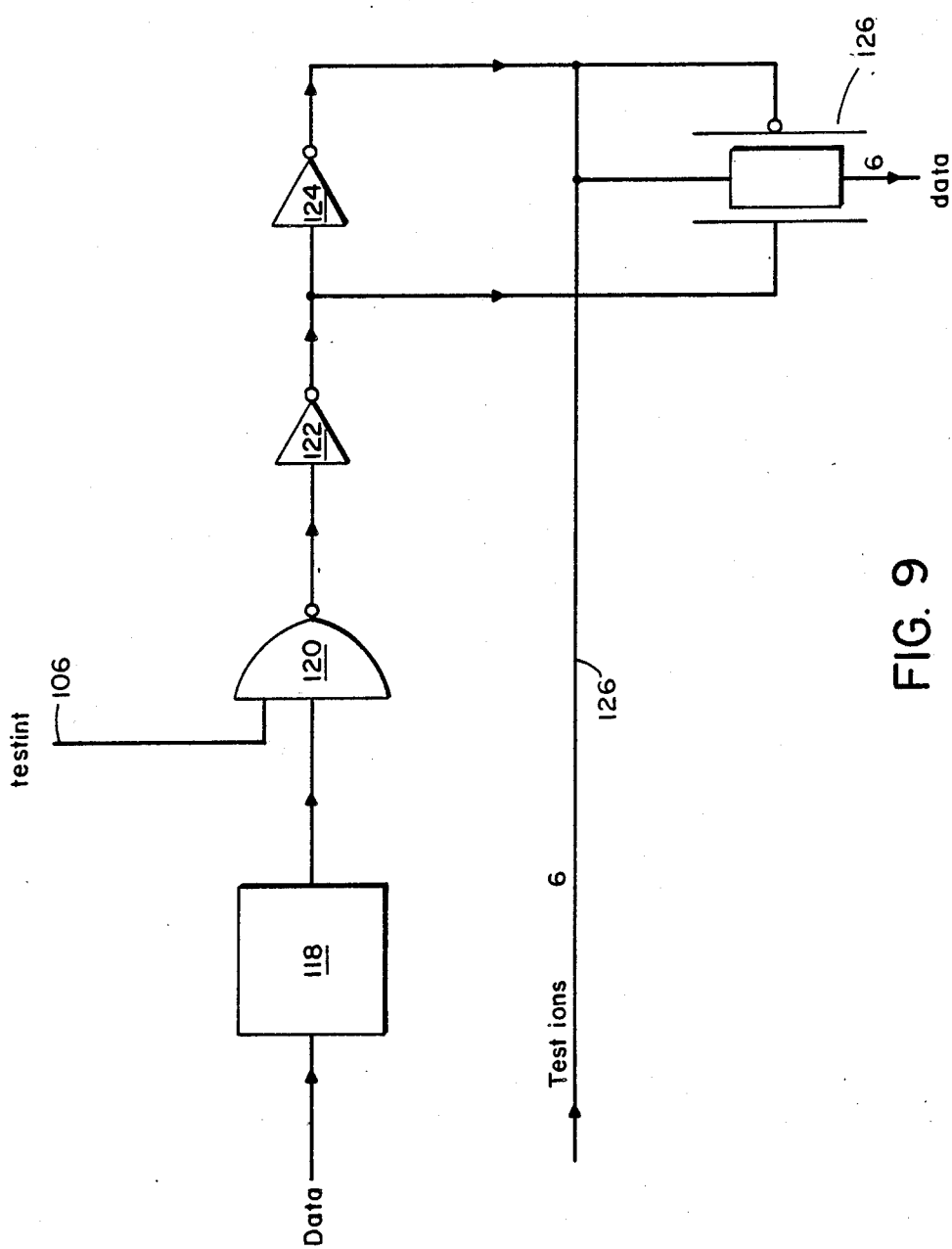
FIG. 9 is a logic diagram of a shift register on the top and bottom sides of the chip.

FIG. 9 illustrates the logic for a stage of the bottom 78 and top 82 shift registers. The data is stored in a flip-flop 118. The output of the flip-flop enters a two input NAND gate 120. The other input of the gate is connected to testing 106. The output of the NAND gate 120 enters an inverter 122. The output of the inverter 122 branches with one branch going into a second inverter 124 and one branch going to one side of a set of complementary FET gates such as 126. The complemented output of the second inverter goes to other side of the FET gates 126. The FET gates 126 act like switches which compile the six I/O conductors 52 of a column to a test bus 127 while the data in the corresponding stage of the shift register is high and testing is high. The signals on the test bus may then access the module 14 in the then selected column and the row that is enabled. Data enters and exits the test bus via input/output blocks. $Y_1$-bot 130, $Y_2$-bot 132, $Y_3$-bot 134, and $Y_4$-bot 136 are inputs when the bottom registers 78 are used. $Y_1$-top 138, $Y_2$-top 140, $Y_3$-top 142, and $Y_4$-top 144 are inputs when the top registers 82 are used. F-bot 146, FN-bot 148, F-top 150, and FN-top 152 are the corresponding outputs.

In summary of the array tests, the shiftconn block is set high and bit patterns are applied to test the registers and the second set of conductors 54. Then a desired module 14 is selected by putting a high signal in the shift registers for the particular row and column desired. This allows access to the module 14 Shiftconn is then set low and testing is set high. Input data is fed into the module using the appropriate input blocks. The produced output can then be examined to determine whether the module is working properly. It also tests if there are any problems in the first set of conductors 52. When the tester wants to test a new module 14, he sets the testing low and sets the shiftconn blocks 86, 88 high. He shifts the column or row, removes the high on the shiftconn blocks 86, 88, sets testing and tests the new module selected By testing modules from both above and below the array, the locations of defects in the chip can be better determined.

Figure 10:
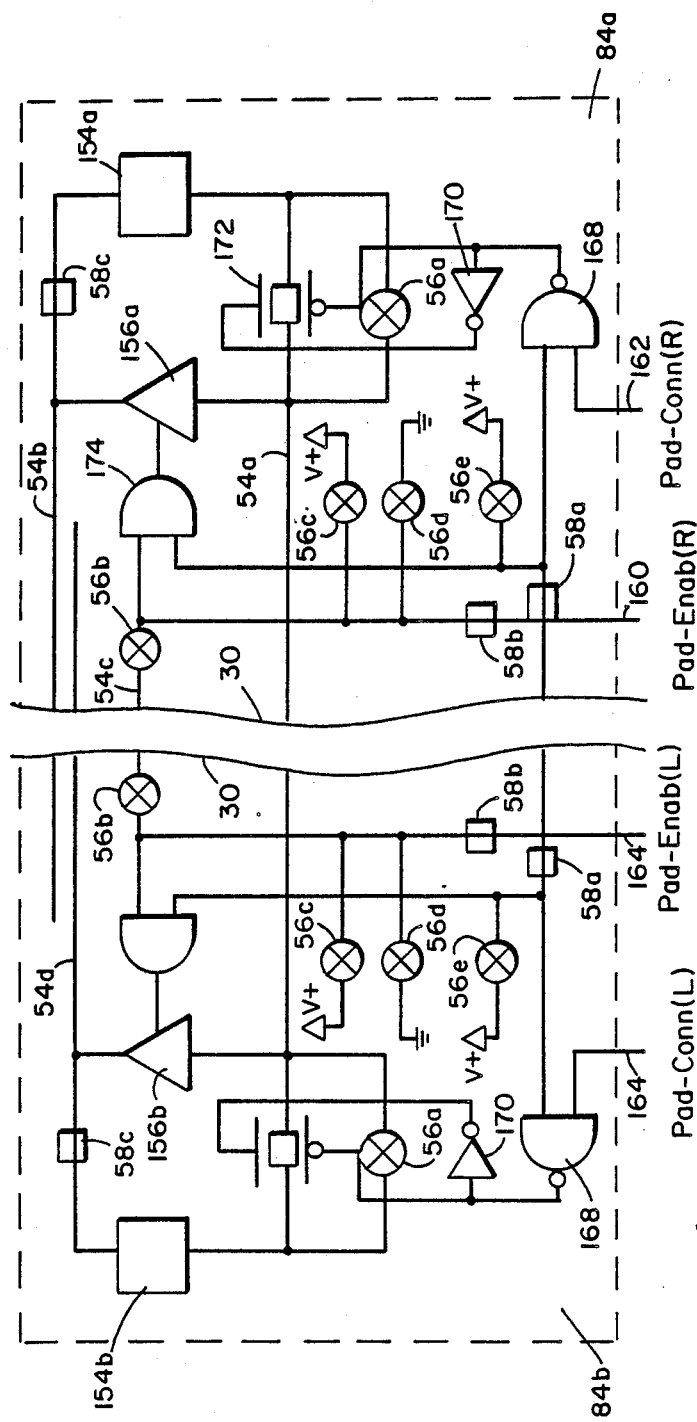
FIG. 10 is a logic diagram of a pair of input/output blocks.

The next phase of the testing process tests the input/output blocks 84. These blocks are organized as pairs 84a, 84b, as shown in the logic diagram of FIG. 10. Each of the blocks has a pad 154a, 154b, to which an I/O wire is coupled in normal use of the chip, and a driver 156a, 156b.

The pad and driver of each pad are coupled to select ones of the second set of conductors 54 to allow for input and output from the chip.

When programmed, I/O block 84a, for example, may provide for input from pad 154a directly to conductor 54a or 54b; for input from pad 154a through driver 156a to conductor 54b; for output from conductor 54a through driver 156a to pad 154a; or for tri-state operation of driver 156a through conductor 54c.

The drivers 156a, 156b are tested by using the pad 154a, 154b of its paired counterpart to provide an input and monitoring the output on its associated pad. These pads are located on opposite sides of the chip. Control of the I/O blocks during testing is through the respective pad-conn and pad-enab lines. These are obtained from the test registers 76, 78, 80 and 82 through 157 (FIG. 8) when test-IO is high.

To test a driver 156a, 156b the opposite pad is used. For purposes of illustration, suppose one driver 156a is to be tested. The test-IO block 158 is set high. The pad-enab(R) 160 is set high so the driver 156a is enabled through an AND gate 174. The other input to the AND gate is the test-IO 158. The pad-conn(R) 162 is set low so as to disconnect the input to the driver 156a from pad 154a. It disconnects the input because the pad-conn(R) 162 enters a NAND gate 168 along with the test-IO 158. When pad-conn(R) 162 is low, the output from the NAND gate 168 is necessarily high. This output goes to an inverter 170. The outputs of the NAND gate 168 and the inverter 170 are connected to complimentary FET gates 172 which act as a switch between the pad 154a and the line 54a of the second set of conductors 54. As can be seen in the diagram, both blocks 84a and 84b share the same line 54a. The pad-enab(L) 164 is set low so as to disable the driver 156b and the pad-conn(L) 166 is set high so as to connect the pad 154b to the input of driver 156a. Thus, test data can be fed into the input line 54a via the pad 154b of the one block to test the driver on the other block 156a, and vice versa.

After testing and during programming, adjustments need to be made to the blocks 84a, 84b. Laser outpoints 58a are provided to out the connector to the test-IO block 158. Outpoints 58b are also provided to disconnect the pad-enab(R) 160 and pad-enab(L) 164. Lastly, outpoints 58c are provided to cut the connection from the drivers output to the inputs of the pads 154a,156b where the circuit design dictates.

Diffuseable links 56 are also used to prepare the blocks 84a, 84b for normal operation. A link 56a connects the pad 154a, 154b to the input of the driver 156a, 156b. Other links 56b connect the conductor 54c to the NAND gate 174 which enables the driver for tri-state operation of the other input is tied high through link 56c. Link 56d ties an input to the AND 174 low to disable the driver in a high impedance state. Line 55c ties this same input high for tri-state operation of the driver from either the pad 154a or the conductor 54d.

Those skilled in the art will recognize, or be able to ascertain using no more than routine experimentation, many equivalents to the specific embodiments of the invention described herein. For instance, other circuitry could be combined within the module array 24. A RAM unit could be combined with the logic arrays. Certain features of the invention may be applied to other methods of programmably interconnecting and disconnecting circuits and particularly other methods utilizing lasers. For example, laser methods of forming links include those presented in U.S. Pat. Nos. 4,585,490 and 4,636,404 to Raffel.

These and all other equivalents are intended to be encompassed by the following claims.

We claim:

1. A laser programmable integrated circuit comprising:
   (a) an array of logic modules;
   (b) a grid-like array of laser breakable conductors in connection with the logic modules comprising:
      (i) a first set of conductors; and
      (ii) a second set of conductors which cross the first set of conductors; wherein the first and second sets of conductors are electrically isolated; and
   (c) a set of laser activated links which connect adjacent conductors that cross when irradiated by a laser beam.

2. A laser programmable integrated circuit as recited in claim 1 wherein each logic module is a functional unit, and produces an expected output when a vector input is applied to the module.

3. A laser programmable integrated circuit as recited in claim 1 wherein each logic module is capable of realizing any combinatorial function of two inputs.

4. A laser programmable integrated circuit as recited in claim 1 the logic modules further comprising:
   (a) a first two input AND gate;
   (b) a second two input AND gate wherein one input is the output of a two input NOR gate, the NOR gate having one input which is also an input for the first AND gate;
   (c) a two input NOR gate wherein the inputs are the outputs of the two AND gates;
   (d) an inverter connected to output of the NOR gate and which produces an output for the module, FN;
   (e) an inverter connected to the output of the other inverter and which produces an output for the module, F;
   (f) an enabling means attached to both inverters.

5. A laser programmable integrated circuit as recited in claim 1 wherein the logic modules have continuous lines connecting the leads of one side of the module to the leads on the opposite side of the module.

6. A laser programmable integrated circuit as recited in claim 1 wherein the grid-like array of laser breakable conductors connects logic modules to other logic modules, inputs, outputs, and chip testing registers.

7. A laser programmable integrated circuit as recited in claim 6 wherein the logic modules are aligned in parallel rows and columns.

8. A laser programmable integrated circuit as recited in claim 7 wherein prior to laser programming, the first and second sets of conductors are unconnected.

9. A laser programmable integrated circuit as recited in claim 1 wherein the laser activated links further comprise two back-to-back diodes formed by doped regions in a substrate separated by a gap of a few microns.

10. A laser programmable integrated circuit as recited in claim 1 wherein the sets of conductors may be severed at given cut points and laser activated links may be connected through irradiation by a laser beam to program the logic modules.

11. A laser programmable integrated circuit as recited in claim 10 wherein the laser activated links are located in such a way that there is a link corresponding to each cross-point of the first and second sets of conductors and the cut points are located in every other conductor segment between the cross-points of the first and second sets of conductors.

12. A laser programmable integrated circuit as recited in claim 1 further comprising chip testing registers to test whether the unprogrammed array and conductors were properly fabricated.

13. A laser programmable integrated circuit comprising:
  (a) an array of logic modules comprising:
    (1) first two input AND gate;
    (2) a second two input AND gate wherein one input is output of a two input NOR gate, the NOR gate having one input which is also an input for the first AND gate;
    (3) a two input NOR gate wherein the inputs are the outputs of the two AND gates;
    (4) an inverter connected to output of the NOR gate and which produces an output for the module, FN;
    (5) an inverter connect of the other inverter and which produces an output for the module, F;
  wherein the logic modules are aligned in parallel rows and columns; the logic modules have continuous lines connecting the leads of one side of the module to the leads on the opposite side of the module;
  (b) a grid-like array of sets of laser breakable conductors which connect the logic modules to other logic modules, inputs and outputs comprising:
    (1) a first set of conductors; and
    (2) a second set of conductors which cross the first set of conductors;
    wherein the first and second sets of conductors are electrically isolated and all the sets of conductors are unconnected prior to laser programming;
  (c) a set of laser diffuseable links which connect adjacent conductors that cross when irradiated by a laser beam; and comprise two diodes formed by doped regions in a substrate separated by a gap of a few microns; wherein to program the logic modules, the conductors may be severed at given out-points arranged between every other conductor segment between the cross-points of the first and second sets of conductors, and the laser diffuseable links are located in such a way that there is a link corresponding to each cross-point of the first and second set of conductors and may be connected through irradiation by a laser beam;
  (d) a set of testing registers for testing whether the unprogrammed modules and conductors have been properly fabricated.

14. A programmable integrated circuit comprising:
  (a) an array of logic modules;
  (b) a first set of continuous input and output conductors interconnecting groups of logic modules, the conductors being breakable to leave programmable interconnections between logic modules; and
  (c) means for selecting individual logic modules for testing of the array through the input and output conductors.

15. A programmable integrated circuit as recited in claim 14 further comprising a second set of continuous conductors crossing the first set of conductors and programmable links for interconnecting cross-points of the first and second sets of conductors.

16. A programmable integrated circuit as recited in claim 15 wherein the links comprise laser diffuseable semiconductor links.

17. A programmable integrated circuit as recited in claim 15 wherein the logic modules are in an array of rows and columns and the first set of conductors includes subsets of conductors, each subset comprising the inputs and outputs for each logic module of a column of logic modules, and the means for selecting a logic module comprises means for enabling a row of logic modules while disabling all other rows.

18. A programmable integrated circuit as recited in claim 17 further comprising means for permanently enabling or disabling a row of logic modules by programmably connecting enable conductors to the row.

19. A programmable integrated circuit as recited in claim 18 further comprising means for enabling or disabling an individual logic module by programmably breaking and linking enable conductors to the logic module.

20. A programmable integrated circuit as recited in claim 17 further comprising means for enabling or disabling an individual logic module by programmably breaking and linking enable conductors to the logic module.

21. A programmed integrated circuit comprising laser diffuseable links and means for applying a back voltage to the non-diffused links.

22. A programmable integrated circuit comprising laser diffuseable links and a set of logic modules arranged in parallel rows and columns, there being continuous lines from leads on one side of the module to the leads on the other side of the module.

23. A programmable integrated circuit as recited in claim 22 further comprising enable lines connected to rows of logic modules capable of enabling or disabling the entire row.

24. A programmable integrated circuit as recited in claim 23 wherein each logic module may be disabled individually.

* * * * *

UNITED STATES PATENT AND TRADEMARK OFFICE
CERTIFICATE OF CORRECTION

PATENT NO. : 4,937,475

DATED : June 26, 1990

INVENTOR(S) : F. Matthew Rhodes and Jack I. Raffel

It is certified that error appears in the above-identified patent and that said Letters Patent is hereby corrected as shown below:

In Claim 13, line 30, change "first" to --a first--; in line 40, change "connect" to --connected to the output--; in line 62, change "outpoints" to --cutpoints--.

Signed and Sealed this

Twenty-fourth Day of September, 1991

Attest:

HARRY F. MANBECK, JR.

Attesting Officer

Commissioner of Patents and Trademarks

REEXAMINATION CERTIFICATE (2254th)

United States Patent [19]

Rhodes et al.

[11] B1 4,937,475

[45] Certificate Issued  Mar. 29, 1994

[54] LASER PROGRAMMABLE INTEGRATED CIRCUIT

[75] Inventors: F. Matthew Rhodes, Arlington; Jack I. Raffel, Lexington, both of Mass.

[73] Assignee: Massachusetts Institute of Technology, Cambridge, Mass.

Reexamination Request:
No. 90/002,565, Feb. 10, 1992

Reexamination Certificate for:
Patent No.: 4,937,475
Issued: Jun. 26, 1990
Appl. No.: 246,311
Filed: Sep. 19, 1988

[51] Int. Cl.$^5$ ............... H04Q 1/00; H03K 3/01; H03K 17/693; H03K 19/096
[52] U.S. Cl. ................. 307/465; 307/465.1; 307/468; 307/202.1; 364/716; 364/784; 340/825.84; 340/825.86; 340/825.87; 340/825.91
[58] Field of Search ............ 307/465, 465.1, 468, 307/202.1, 303, 303.1; 365/96; 437/173; 148/DIG. 93; 340/825.83, 825.84; 364/716; 371/22.2, 22.5; 324/73.1, 523, 527

[56] References Cited

U.S. PATENT DOCUMENTS

| | | | |
|---|---|---|---|
| 4,238,839 | 12/1980 | Redfern et al. | 365/96 |
| 4,366,393 | 12/1982 | Kasuya | 307/465 |
| 4,642,487 | 2/1987 | Carter | 307/465.1 |
| 4,758,745 | 7/1988 | Elgamal et al. | 307/465 |
| 4,835,118 | 5/1989 | Jones et al. | 437/173 |
| 4,868,426 | 9/1989 | Brockmann | 307/465 |
| 4,968,643 | 11/1990 | Mukai | 148/DIG. 93 X |

FOREIGN PATENT DOCUMENTS

0223308  5/1987  European Pat. Off. ............ 307/465
139023  7/1985  Japan .................................. 307/465

OTHER PUBLICATIONS

Rhodes et al., "A Chip Design for Rapid Turnaround IC Customization Using Laser Programmed Connectons", MIT Lincoln Laboratory, Digital Integrated Circuits Group, Nov. 1989, 3 pages.
Garverick et al., "A Simple Wafer 16-Point 16-MHz FFT Processor", IEEE Proceedings Of Custom Integrated Circuits Conference, May 1983, pp. 244-248.
Raffel et al., "A Wafer-Scale Digital Integerator Using Restructurable VSLI", IEEE Journal of Solid-State Circuits, vol. SC-20, No. 1, Feb. 1985, 399-406.
El Gamal et al., "An Architecture for Electrically Configurable Gate Arrays", IEEE 1988 Custom Integrated Circuits Conference, CH2584-1/88/0000-0091, pp. 15.4.1-15.4.4.
Canter et al., "A Laser-Diffused Link for Wafer-Scale Integration Using Standard CMOS Processing" MIT Lincoln Laboratory, Abstract and Extended Abstracts, CLEO '88, Anaheim, Calif., Apr. 24-29, 1988, 4 pages.
El-Ayat et al., "WPM 7.5: A CMOS Electrically Configurable Gate Array" Session VII: Gate Arrays, IEEE International Solid State Circuit Conference, ISCC 88/Feb. 17, 1988, 1 page.

*Primary Examiner*—Timothy P. Callahan

[57] ABSTRACT

A laser programmable integrated circuit chip has a plurality of logic modules organized as rows and columns. The modules and other chip components are connected by a grid-like array of conductors. The conductors are initially unattached. Customization occurs by fusing laser diffuseable links and severing cut points on the conductors. The modules have continuous conductor lines running through them. These conductor lines aid in testing and are useful in routing and error avoidance. The chip also contains test registers to test the array of logic modules, the input/output blocks, and the conductors.

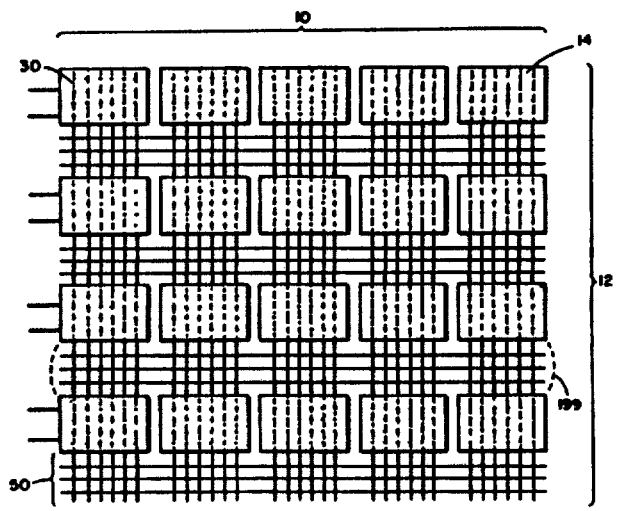

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, lines 1–12:
The logic modules 14 are interconnected to each other and to the rest of the integrated circuit components via a grid-like array 50 (FIGS. 1 and 4) of a first set of conductors 52 which pass through columns of modules [which pass between rows of modules] and a second set of conductors 54 *which pass between rows of modules* (FIG. 4). The number of conductors in the first set corresponds to the number of input/output leads per module per column. Any number of conductors may be included in the second set; although only three are shown in FIG. 1 between each row of modules, [in] the preferred implementation has eight.

Column 4, lines 34–39:
The [out] *cut* points 58 are arranged as shown in FIG. 4. Cut points 58 appear in the first conductors between every other pair of second conductors 62. They also appear in alternating segments of second conductors 54, the segments being staggered from conductor 54 to conductor.

Column 4, lines 40–60:
A preferred laser diffuseable link is as shown in U.S. patent application Ser. No. 65,320, filed by Canter et al., Jun. 22, 1987, and assigned to the assignee of this invention. An example for a laser link for wafer-scale integration using standard IC processing, is shown in FIGS. 5 and 6. It is comprised of two back-to-back diodes 64a, 67 and 64b, 67 separated by a gap of a few microns 65. The diodes are formed by heavily doping regions 64a, 64b in a substrate 67. The regions are implanted through normal oxide windows like those which define the source and drain regions of a transistor. The diodes are connected to the horizontal wires 52 and vertical wires 54, respectively. The links are connected in programming by aiming a laser at the gap 65 between the doped regions 64a, 64b and, thus, causing dopant to be redistributed in to the gap 65 to create a new connection. The arrays of regions 64a, 64b are formed in wells 199 (FIG. 1). An increased bias voltage opposite [is] *in* potential to the potential applied to the conductors is applied to the wells. The effect of applying the voltage is to substantially decrease parasitic capacitance of such links 56.

Column 6, lines 43–65:
FIG. 9 illustrates the logic for a stage of the bottom 78 and top 82 shift registers. The data is stored in a flip-flop 118. The output of the flip-flop enters a two input NAND gate 120. The other input of the gate is connected to [testing] *testint* 106. The output of the NAND gate 120 enters an inverter 122. The output of the inverter 122 branches with one branch going into a second inverter 124 and one branch going to one side of a set of complementary FET gates such as 126. The complemented output of the second inverter goes to the other side of the FET gates 126. The FET gates 126 act like switches which [compile] *connect* the six I/O conductors 52 of a column to a test bus 127 while the data in the corresponding stage of the shift register is high and [testing] *testint* is high. The signals on the test bus may then access the module 14 in the then selected column and the row that is enabled. Data enters and exits the test bus via input/output blocks. $Y_1$-bot 130, $Y_2$-bot 132, $Y_3$-bot 134, and $Y_4$-bot 136 are inputs when the bottom registers 78 are used. $Y_1$-top 138, $Y_2$-top 140, $Y_3$-top 142, and $Y_4$-top 144 are inputs when the top registers 82 are used. F-bot 146, FN-bot 148, F-top 150, and FN-top 152 are the corresponding outputs.

Column 7, lines 61–68:
After testing and during programming, adjustments need to be made to the blocks 84a, 84b. Laser [outpoints] *cutpoints* 58a are provided to [out] *cut* the connector to the test-IO block 158. [Outpoints] *Cutpoints* 58b are also provided to disconnect the pad-enab(R) 160 and pad-enab(L) 164. Lastly, [outpoints] *cutpoints* 58c are provided to cut the connection from the drivers output to the inputs of the pads 154a,156b where the circuit design dictates.

The drawing figures have been changed as follows: Numerical reference "40" has been changed to 90. Indicating line of numerical reference 76 changed from shift-bottom means to shift-left means.

AS A RESULT OF REEXAMINATION, IT HAS BEEN DETERMINED THAT:

The patentability of claims 3–5, 9, 12, and 14–20 is confirmed.

Claims 1 and 2 are cancelled.

Claims 6, 10, 13, and 21–23 are determined to be patentable as amended.

Claims 7, 8, 11, and 24, dependent on an amended claim, are determined to be patentable.

6. A laser programmable integrated circuit as recited in claim 1 wherein, *before programming,* the grid-like array of laser breakable conductors connects logic [modules] *module inputs and outputs* to *all* other logic modules *of a column,* inputs, outputs, and chip testing registers.

10. A laser programmable integrated circuit as recited in claim [1] *5* wherein the sets of conductors may be severed at given cut points and laser activated links may be connected through irradiation by a laser beam to program the logic modules.

13. A laser programmable integrated circuit comprising:
(a) an array of logic modules comprising:
(1) *a first NOR gate having two inputs;*

[(1)] *(2)* first [two input] AND gate *having two inputs, one input being coupled to an input of the first NOR gate;*

[(2)] *(3)* a second [two input] AND gate *having two inputs,* wherein one input is *an* output of [a two input] *the first* NOR gate[, the NOR gate having one input which is also an input for the first AND gate];

[(3)] *(4)* a [two input] *second* NOR gate *having two inputs,* wherein the inputs are the outputs of the [two] *first and second* AND gates;

[(4) an] *(5) a first* inverter connected to *an* output of the *second* NOR gate [and which produces] *for producing* an output for the module, FN;

[(5) an] *(6) a second* inverter connected to the output of the [other] *first* inverter [and which produces] *for producing* an output for the module, F;

*for producing* an output for the module, F;

wherein the logic modules are aligned in parallel rows and columns; the logic modules have continuous lines connecting the leads of one side of the module to the leads on the opposite side of the module;

(b) a grid-like array of sets of laser breakable conductors which connect the logic modules to other logic modules, inputs and outputs comprising:
(1) a first set of conductors; and
(2) a second set of conductors which cross the first set of conductors;
wherein the first and second sets of conductors are electrically isolated and all the sets of conductors are unconnected prior to laser programming;

(c) a set of laser diffuseable links which connect adjacent conductors that cross when irradiated by a laser beam; and comprise two diodes formed by doped regions in a substrate separated by a gap of a few microns; wherein to program the logic modules, the conductors may be severed at given [outpoints] *cutpoints* arranged between every other conductor segment between the cross-points of the first and second sets of conductors, and the laser diffuseable links are located in such a way that there is a link corresponding to each cross-point of the first and second set of conductors and may be connected through irradiation by a laser beam;

(d) a set of testing registers for testing whether the unprogrammed modules and conductors have been properly fabricated.

21. A programmed integrated circuit comprising:
*a plurality of* laser diffuseable links; and
means *coupled to said plurality of laser diffuseable links* for applying a back voltage to the non-difussed links.

22. A programmable integrated circuit comprising:
*an array of horizontal and vertical conductors;*
*an array of* laser diffuseable links *for interconnecting the conductor;* and
a set of logic modules arranged in parallel rows and columns, [there being continuous lines from leads on one side of the module to the leads on the other side of the module] *inputs and ouputs of the logic modules being connected to the vertical conductors which extend continuously past a full column of logic modules;* and
means *for selecting an individual module of a column for testing through the vertical conductors.*

23. A programmable integrated circuit as recited in claim 22 [further comprising] *wherein the means for selecting comprises* enable lines connected to rows of logic modules capable of enabling or disabling the entire row.

* * * * *